(12) United States Patent
Sewell et al.

(10) Patent No.: US 11,894,472 B2
(45) Date of Patent: Feb. 6, 2024

(54) LEAVE-IN ETCH MASK FOR FOIL-BASED METALLIZATION OF SOLAR CELLS

(71) Applicant: Maxeon Solar Pte. Ltd., Singapore (SG)

(72) Inventors: Richard Hamilton Sewell, Los Altos, CA (US); David Fredric Joel Kavulak, Fremont, CA (US); Taeseok Kim, Pleasanton, CA (US); Gabriel Harley, Mountain View, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 136 days.

(21) Appl. No.: 17/082,995

(22) Filed: Oct. 28, 2020

(65) Prior Publication Data
US 2021/0057593 A1 Feb. 25, 2021

Related U.S. Application Data

(63) Continuation of application No. 14/752,828, filed on Jun. 26, 2015, now abandoned.

(51) Int. Cl.
*H01L 31/0224* (2006.01)
*H01L 31/068* (2012.01)
*H01L 31/18* (2006.01)

(52) U.S. Cl.
CPC .. *H01L 31/022441* (2013.01); *H01L 31/0682* (2013.01); *H01L 31/1804* (2013.01); *Y02E 10/547* (2013.01); *Y02P 70/50* (2015.11)

(58) Field of Classification Search
CPC ......... H01L 31/1804; H01L 31/022441; H01L 31/0682; Y02E 10/547; Y02P 70/50
See application file for complete search history.

(56) References Cited

U.S. PATENT DOCUMENTS

| 3,993,533 | A | 11/1976 | Milnes et al. |
| 4,058,418 | A | 11/1977 | Lindmayer |

(Continued)

FOREIGN PATENT DOCUMENTS

| CN | 102132423 | 7/2011 |
| DE | 10020412 | 11/2001 |

(Continued)

OTHER PUBLICATIONS

Cotter, et al., "Novel Process for Simplified Buried Contact Solar Cells," Institute of Electrical and Electronics Engineers, Aug. 2000, pp. 303-306.

(Continued)

*Primary Examiner* — Kourtney R S Carlson
(74) *Attorney, Agent, or Firm* — Schwabe, Williamson & Wyatt, P.C.

(57) ABSTRACT

Approaches for fabricating foil-based metallization of solar cells based on a leave-in etch mask, and the resulting solar cells, are described. In an example, a solar cell includes a substrate having a back surface and an opposing light-receiving surface. A plurality of alternating N-type and P-type semiconductor regions is disposed in or above the back surface of the substrate. A conductive contact structure is disposed on the plurality of alternating N-type and P-type semiconductor regions. The conductive contact structure includes metal foil portions in alignment with corresponding ones of the alternating N-type and P-type semiconductor regions. A patterned wet etchant-resistant polymer layer is disposed on the conductive contact structure. Portions of the patterned wet etchant-resistant polymer layer are disposed on and in alignment with the metal foil portions.

20 Claims, 6 Drawing Sheets

(56) References Cited

U.S. PATENT DOCUMENTS

| | | | |
|---|---|---|---|
| 4,318,938 | A | 3/1982 | Barnett et al. |
| 4,393,576 | A | 7/1983 | Dahlberg |
| 4,400,577 | A | 8/1983 | Spear |
| 4,433,200 | A | 2/1984 | Jester et al. |
| 4,461,922 | A | 7/1984 | Gay et al. |
| 4,482,780 | A | 11/1984 | Mitchell |
| 4,581,103 | A | 4/1986 | Levine et al. |
| 4,582,588 | A | 4/1986 | Jensen et al. |
| 4,617,421 | A | 10/1986 | Nath et al. |
| 4,691,076 | A | 9/1987 | Levine et al. |
| 4,695,674 | A | 9/1987 | Bar-on |
| 4,697,041 | A | 9/1987 | Okaniwa et al. |
| 4,882,298 | A | 11/1989 | Moeller et al. |
| 4,917,752 | A | 4/1990 | Jensen et al. |
| 4,957,601 | A | 9/1990 | Levine et al. |
| 5,091,319 | A | 2/1992 | Hotchkiss et al. |
| 5,227,009 | A * | 7/1993 | Sunakawa ............... C09J 7/241 216/102 |
| 5,380,371 | A | 1/1995 | Murakami |
| 5,951,786 | A | 9/1999 | Gee et al. |
| 5,980,679 | A | 11/1999 | Severin et al. |
| 6,159,832 | A | 12/2000 | Mayer |
| 6,288,326 | B1 | 9/2001 | Hayashi et al. |
| 6,448,155 | B1 | 9/2002 | Iwasaki et al. |
| 6,635,307 | B2 | 10/2003 | Huang et al. |
| 7,355,114 | B2 | 4/2008 | Ojima et al. |
| 8,003,530 | B2 | 8/2011 | Grohe et al. |
| 8,146,643 | B2 | 4/2012 | Kasahara et al. |
| 8,574,950 | B2 * | 11/2013 | Clevenger ......... H01L 31/02164 438/98 |
| 8,766,090 | B2 | 7/2014 | Sewell et al. |
| 8,809,192 | B2 | 8/2014 | Bertram et al. |
| 9,040,409 | B2 | 5/2015 | Kumar et al. |
| 2005/0253142 | A1 | 11/2005 | Negami et al. |
| 2006/0166023 | A1 | 7/2006 | Yoshikata et al. |
| 2006/0213548 | A1 | 9/2006 | Bachrach et al. |
| 2008/0035198 | A1 * | 2/2008 | Teppe ............... H01L 31/022458 257/E33.001 |
| 2008/0042153 | A1 | 2/2008 | Beeson et al. |
| 2008/0128019 | A1 | 6/2008 | Lopatin et al. |
| 2008/0216887 | A1 | 9/2008 | Hacke et al. |
| 2008/0223429 | A1 | 9/2008 | Everett et al. |
| 2009/0194162 | A1 | 8/2009 | Sivaram et al. |
| 2010/0032013 | A1 | 2/2010 | Krause et al. |
| 2010/0071765 | A1 | 3/2010 | Cousins et al. |
| 2010/0200058 | A1 | 8/2010 | Funakoshi |
| 2010/0243041 | A1 | 9/2010 | Carson et al. |
| 2011/0162703 | A1 | 7/2011 | Adibi et al. |
| 2012/0097245 | A1 | 4/2012 | Nishina et al. |
| 2012/0103408 | A1 * | 5/2012 | Moslehi ............... H01L 31/1804 257/E31.124 |
| 2012/0204938 | A1 | 8/2012 | Hacke et al. |
| 2012/0208411 | A1 * | 8/2012 | Krokoszinski .......... B32B 37/02 29/877 |
| 2012/0240995 | A1 | 9/2012 | Coakley et al. |
| 2013/0081680 | A1 * | 4/2013 | Molesa ............... H01L 31/0352 257/E31.13 |
| 2013/0160825 | A1 | 6/2013 | Lantzer et al. |
| 2013/0183796 | A1 | 7/2013 | Stewart et al. |
| 2014/0080251 | A1 | 3/2014 | Cousins et al. |
| 2015/0295122 | A1 * | 10/2015 | Crafts ................ H01L 31/18 438/98 |

FOREIGN PATENT DOCUMENTS

| | | |
|---|---|---|
| EP | 1634673 | 3/2006 |
| JP | 2003/246971 | 9/2003 |
| JP | 2009/130116 | 6/2009 |
| JP | 2011/054831 | 3/2011 |
| WO | WO 1999/040760 | 8/1999 |
| WO | WO 2010/025269 | 3/2010 |
| WO | WO 2010/033296 | 3/2010 |
| WO | WO 2013/028433 | 2/2013 |

OTHER PUBLICATIONS

International Search Report and Written Opinion for PCT Patent Application No. PCT/US16/39108 dated Oct. 5, 2016, 15 pgs.

First Action Interview Pre-Interview Communication from U.S. Appl. No. 14/752,828 dated Oct. 5, 2017, 9 pgs.

International Preliminary Report on Patentability from PCT/US2016/039108 dated Jan. 4, 2018, 11 pgs.

First Action Interview from U.S. Appl. No. 14/752,828 dated Jan. 9, 2018, 5 pgs.

Non-final Office Action from U.S. Appl. No. 14/752,828 dated Jul. 18, 2018, 16 pgs.

Final Office Action from U.S. Appl. No. 14/752,828 dated Feb. 25, 2019, 11 pgs.

Final Office Action from U.S. Appl. No. 14/752,828 dated Jun. 14, 2019, 11 pgs.

Non-final Notice of Reasons for Rejection from Japanese Patent Application No. 2018-182848 dated Oct. 16, 2019, 7 pgs.

Non-final Office Action from U.S. Appl. No. 14/752,828 dated Dec. 3, 2019, 17 pgs.

Final Office Action from U.S. Appl. No. 14/752,828 dated May 29, 2020, 13 pgs.

Office Action from Taiwan Patent Application No. 105120074 dated Aug. 12, 2020, 15 pgs.

* cited by examiner

LEAVE-IN ETCH MASK FOR FOIL-BASED METALLIZATION OF SOLAR CELLS

CROSS-REFERENCE TO RELATED APPLICATIONS

This application is a continuation of U.S. patent application Ser. No. 14/752,828, filed on Jun. 26, 2015, the entire contents of which are hereby incorporated by reference herein.

TECHNICAL FIELD

Embodiments of the present disclosure are in the field of renewable energy and, in particular, include approaches for fabricating foil-based metallization of solar cells based on a leave-in etch mask, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

Figure 1:
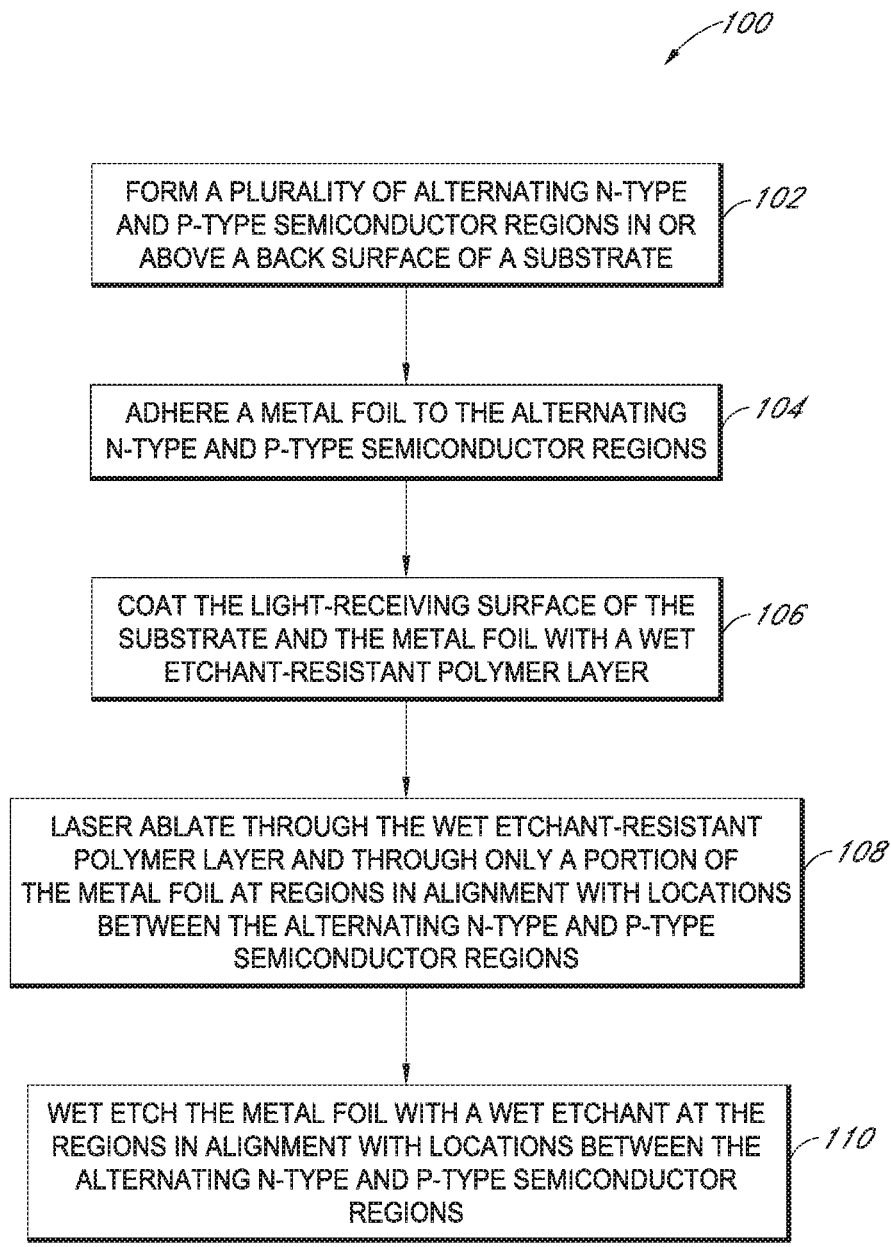
FIG. 1 is a flowchart illustrating operations in a method of fabricating a solar cell, in accordance with an embodiment of the present invention.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Approaches for fabricating foil-based metallization of solar cells based on a leave-in etch mask, and the resulting solar cells, are described herein. In the following description, numerous specific details are set forth, such as specific paste compositions and process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells. In one embodiment, a method of fabricating a solar cell includes forming a plurality of alternating N-type and P-type semiconductor regions in or above a back surface of a substrate, opposite a light-receiving surface of the substrate. The method also includes adhering a metal foil to the alternating N-type and P-type semiconductor regions. The method also includes coating the light-receiving surface of the substrate and the metal foil with a wet etchant-resistant polymer layer. The method also includes laser ablating through the wet etchant-resistant polymer layer and through only a portion of the metal foil at regions in alignment with locations between the alternating N-type and P-type semiconductor regions, the laser ablating forming a patterned wet etchant-resistant polymer mask. The method also includes, subsequent to the laser ablating, wet etching the metal foil with a wet etchant at the regions in alignment with locations between the alternating N-type and P-type semiconductor regions to isolate remaining portions of the metal foil in alignment with the alternating N-type and P-type semiconductor regions.

In another embodiment, a method of fabricating a solar cell includes forming a plurality of alternating N-type and P-type semiconductor regions in or above a back surface of a substrate, opposite a light-receiving surface of the substrate. The method also includes adhering a metal foil to the alternating N-type and P-type semiconductor regions. The method also includes forming a wet etchant-resistant polymer layer on the metal foil but not on the light-receiving surface of the substrate. The method also includes laser ablating through the wet etchant-resistant polymer layer and through only a portion of the metal foil at regions in alignment with locations between the alternating N-type and P-type semiconductor regions, the laser ablating forming a patterned wet etchant-resistant polymer mask from the wet etchant-resistant polymer layer. The method also includes, subsequent to the laser ablating, wet etching the metal foil with a wet etchant at the regions in alignment with locations between the alternating N-type and P-type semiconductor regions to isolate remaining portions of the metal foil in alignment with the alternating N-type and P-type semiconductor regions.

Also disclosed herein are solar cells. In one embodiment, a solar cell includes a substrate having a back surface and an opposing light-receiving surface. A plurality of alternating N-type and P-type semiconductor regions is disposed in or above the back surface of the substrate. A conductive contact structure is disposed on the plurality of alternating N-type and P-type semiconductor regions. The conductive contact structure includes metal foil portions in alignment with corresponding ones of the alternating N-type and P-type semiconductor regions. A patterned wet etchant-resistant polymer layer is disposed on the conductive contact structure. Portions of the patterned wet etchant-resistant polymer layer are disposed on and in alignment with the metal foil portions.

One or more embodiments described herein are directed to leave-in etch masks for foil-based metallization of solar cells. Embodiments described herein involve implementation of a process for patterning a metal (such as aluminum) foil into an interdigitated structure to serve as the back side metallization for a solar cell. Subsequent to bonding the metal foil bonded to a cell either by thermo-compression bonding or laser welding, the entire structure is coated with a thin layer of resist material, such as a polyolefin. The resist is then laser pattered to form a patterned resist for a subsequent etch process used to remove exposed regions of the metal foil. The resist may be selected to be optically transparent and compatible with the module encapsulation so that it need not necessarily be removed following the etching process.

To provide context, etch based patterning of thick (e.g., approximately 37 micron) aluminum foil is challenging since typical printable resists do not have sufficient resistance to survive long (e.g., 15 minutes) etch times in strong acid or alkaline solutions. Furthermore, resist materials that may otherwise be suitable for such a long etch typically require processing with hazardous solvents. Laser grooving the foil prior to etching reduces the time required in the etch process. However, an etch resist may still be used to prevent excessive etching of non-grooved portions of the metal foil. Another possible issue is addressing the use of a mask on both sides of the corresponding metal foil tabs which extend off of the wafer. Screen printing is a single sided process, and the front side of the tab must be masked all the way to the edge of the cell. Furthermore, the step edge between the cell and the tab on the front side renders printing on the tab portion challenging.

In accordance with one or more embodiments of the present disclosure, an entire wafer and metal foil assembly is coated in resist subsequent to bonding the metal to the wafer. Dip, spray, powder or spin coating are possible options for coating the wafer and metal foil assembly. In one embodiment, the resist material is chosen such that it coats the front of the cell and remains on the front side without causing a loss in performance by otherwise introducing problems in the module manufacture. In one embodiment, the resist is largely transparent to solar radiation. By coating the entire foil and cell, the tabs and the front surface are protected from the etchant. Furthermore, since the coating is not a patterned coat, cost effective spray, dip or powder coating may be employed. Subsequent to applying the coating, an interdigitated finger pattern can be cut into the resist with a laser or mechanical cutting approach. Simultaneous cutting or grooving of the underlying aluminum foil may be advantageous since this approach reduces the required etch time. The patterned device is then etched in an acid or alkaline solution to remove the remaining aluminum and isolate the finger structure. Suitable etchants may include, but are not limited to, NaOH, KOH, HCL, PAWN, as described in greater detail below.

In the first general embodiment described below, a method of patterning an aluminum (or other metal) foil bonded to a solar cell involves use of a mask groove and etch process. A mask such as a polyolefin mask resistant to acidic and alkaline etchants is employed, and may be retained in the final module. The mask can be employed by coating the front of the cell, for further protection of the cell from the etch chemistry. As is also described in greater detail below, the mask can be re-melted during a tab welding process.

In a first approach, FIG. 1 is a flowchart 100 illustrating operations in a method of fabricating a solar cell, in accordance with an embodiment of the present invention. FIGS. 2A-2F illustrate cross-sectional views of various operations corresponding to the flowchart 100 of FIG. 1, in accordance with an embodiment of the present invention.

Figure 2A:
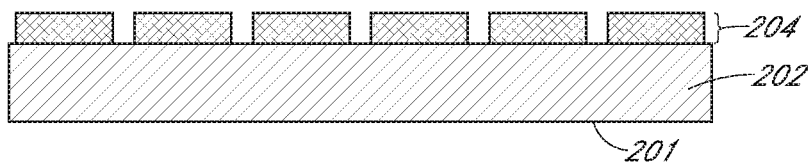
FIGS. 2A-2F illustrate cross-sectional views of various operations corresponding to the flowchart of FIG. 1, in accordance with an embodiment of the present invention.

Referring to operation 102 of flowchart 100 and to corresponding FIG. 2A, a method of fabricating a solar cell includes forming a plurality of alternating N-type and P-type semiconductor regions in or above a back surface of a substrate 202, opposite a light-receiving surface 201 of the substrate 202. The plurality of alternating N-type and P-type semiconductor regions may be referred to herein as fingers of alternating polarity. A patterned insulating layer 204, such as a patterned bottom anti-reflective coating (BARC) layer, is formed between plurality of alternating N-type and P-type semiconductor regions, exposing portions of the plurality of alternating N-type and P-type semiconductor regions.

In an embodiment, the substrate 202 is a monocrystalline silicon substrate, and the plurality of alternating N-type and P-type semiconductor regions is a plurality of N-type and P-type diffusion regions formed in the silicon substrate 202. In another embodiment, however, the plurality of alternating N-type and P-type semiconductor regions is a plurality of N-type and P-type polycrystalline silicon regions formed above the back surface of the substrate 202 (e.g., as polycrystalline silicon emitter regions formed on a dielectric layer formed on the back surface of the substrate 202).

In the latter embodiment, alternating N-type and P-type semiconductor regions described herein are formed from polycrystalline silicon. In one such embodiment, the N-type polycrystalline silicon emitter regions are doped with an N-type impurity, such as phosphorus. The P-type polycrystalline silicon emitter regions 106 are doped with a P-type impurity, such as boron. The alternating N-type and P-type semiconductor regions may have trenches formed there between, the trenches extending partially into the substrate 202. Additionally, although not depicted, in one embodiment, a bottom anti-reflective coating (BARC) material or other protective layer (such as a layer amorphous silicon) may be formed on the alternating N-type and P-type semiconductor regions. The alternating N-type and P-type semiconductor regions may be formed on a thin dielectric tunneling layer formed on the back surface of the substrate 202.

In an embodiment, although not depicted, the light receiving surface 201 is a texturized light-receiving surface. In one embodiment, a hydroxide-based wet etchant is employed to texturize the light receiving surface of the substrate. In an embodiment, a texturized surface may be one which has a regular or an irregular shaped surface for scattering incoming light, decreasing the amount of light reflected off of the light receiving surface of the solar cell. Additional embodiments can include formation of a passivation and/or anti-reflective coating (ARC) layers on the light-receiving surface.

Figure 2B:
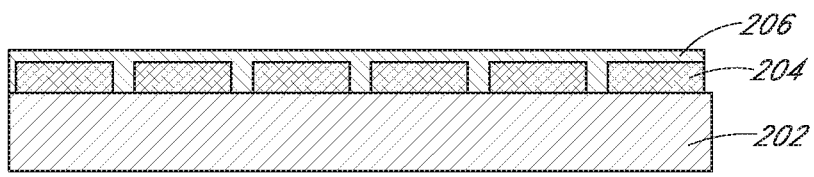

Referring to FIG. 2B, in an embodiment, a metal seed material layer 206 is formed over the structure of FIG. 2A. The metal seed material layer 206 may be referred to as a M1 layer for the solar cell. In a particular such embodiment, the metal seed material layer 206 is an aluminum-based layer. In one such embodiment, the aluminum-based layer has a thickness approximately in the range of 0.3 to 20 microns and is composed of aluminum in an amount greater than approximately 97% and silicon in an amount approximately in the range of 0-2%.

Figure 2C:
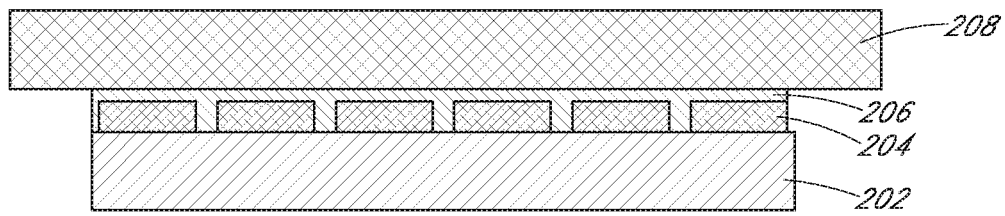

Referring to operation 104 of flowchart 100 and to corresponding FIG. 2C, the method of fabricating a solar cell includes adhering a metal foil 208 to the alternating N-type and P-type semiconductor regions, e.g., by adhering to the metal seed material layer 206 which is adhered to the alternating N-type and P-type semiconductor regions. In an embodiment, the metal foil 208 is adhered to the alternating N-type and P-type semiconductor regions by first locating the metal foil 208 above the plurality of alternating N-type and P-type semiconductor regions. The metal foil 208 is then bonded to the alternating N-type and P-type semiconductor regions by laser welding or thermal compression bonding.

In an embodiment, the metal foil 208 is an M2 layer for the solar cell. In one such embodiment, the metal foil 208 is an aluminum (Al) foil having a thickness approximately in the range of 5-100 microns and, preferably, a thickness approximately in the range of 30-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In another embodiment, a copper foil, or a copper layer supported on a carrier, is used the "metal foil." In some embodiments, a protective layer such as a zincate layer is included on one or both sides of the metal foil.

Figure 2D:
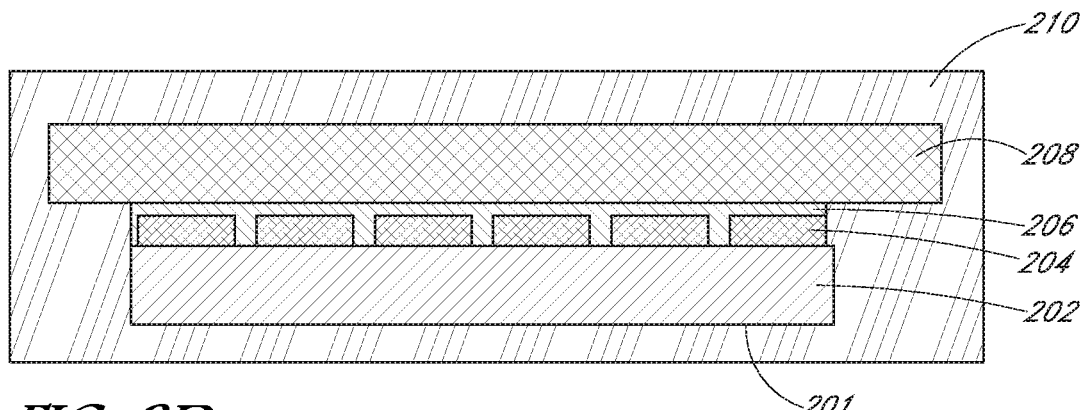

Referring to operation 106 of flowchart 100 and to corresponding FIG. 2D, the method of fabricating a solar cell includes coating the light-receiving surface 201 of the substrate 202 and the metal foil 208 with a wet etchant-resistant polymer layer 210. In an embodiment, the light-receiving surface 201 of the substrate 202 and the metal foil 208 are coated with a layer of a polyolefin material as the wet etchant-resistant polymer layer 210. In an embodiment, the wet etchant-resistant polymer layer 210 is a material substantially transparent to light (e.g. a polyolefin), and is also resistant to a subsequent etch chemistry. In other embodiments, the wet etchant-resistant polymer layer 210 is a thin inorganic layers (e.g., TCO, SiN, $Al_2O_3$, $SiO_2$), which may also serve as a passivation layer.

Figure 2E:
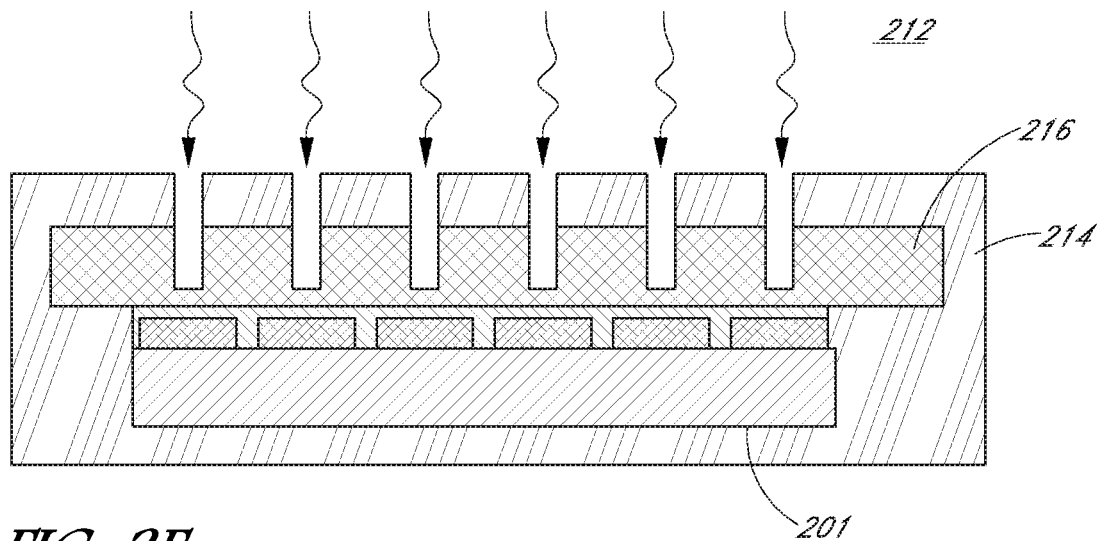

Referring to operation 108 of flowchart 100 and to corresponding FIG. 2E, the method of fabricating a solar cell includes laser ablating 212 through the wet etchant-resistant polymer layer 210 and through only a portion of the metal foil 208 at regions in alignment with locations between the alternating N-type and P-type semiconductor regions (e.g., above regions of the patterned insulating layer 204). The laser ablating 212 forms a patterned wet etchant-resistant polymer mask 214 and a partially patterned metal foil 216. In an embodiment, the laser ablating 212 ablates a thickness approximately in the range of 80-99% of an entire thickness of the metal foil 208.

Figure 2F:
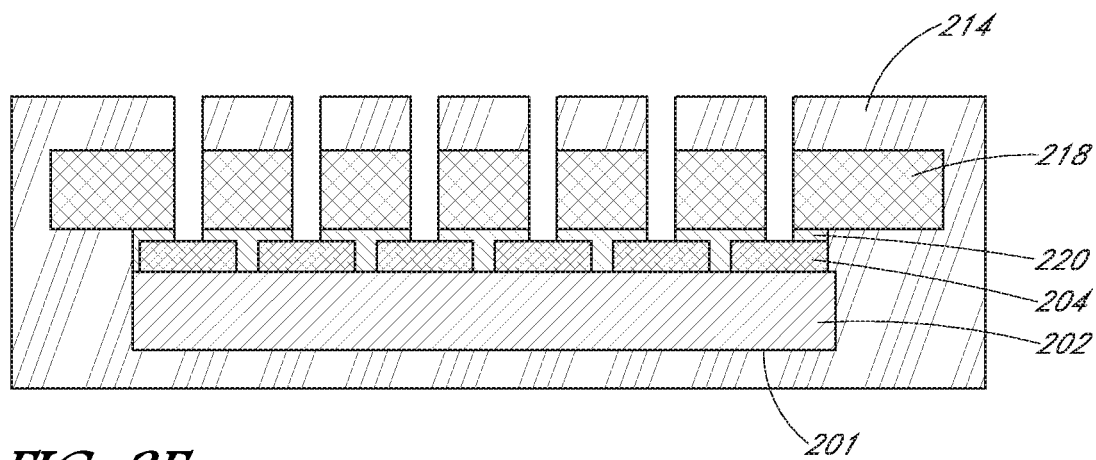

Referring to operation 110 of flowchart 100 and to corresponding FIG. 2F, the method of fabricating a solar cell includes, subsequent to the laser ablating 212, wet etching the patterned metal foil 216 with a wet etchant at the regions in alignment with locations between the alternating N-type and P-type semiconductor regions (e.g., to expose portions of the patterned insulating layer 204). The wet etching isolates remaining portions 218 of the metal foil 208 in alignment with the alternating N-type and P-type semiconductor regions of the substrate 202. The patterned wet etchant-resistant polymer mask 214 protects other regions of the patterned metal foil 216 and the substrate 202 from damage or erosion during the wet etch treatment.

In an embodiment, wet etching the exposed regions of the patterned metal foil 216 with the wet etchant involves etching using a wet etchant such as, but not limited to, a solution of potassium hydroxide (KOH), a solution of sodium hydroxide (NaOH), a solution of hydrochloric acid, or a phosphoric acetic water nitric (PAWN) etchant. In an embodiment, where a metal seed material layer 206 is included, the wet etching process also patterns the metal seed material layer 206 to form isolated metal seed material regions 220. Accordingly, in one such embodiment, wet etching the metal seed material layer 206 with the wet etchant involves exposing portions of a patterned bottom anti-reflective coating (BARC) layer formed at locations between the alternating N-type and P-type semiconductor regions of the substrate 202.

The solar cell depicted in FIG. 2F, as an isolated structure, can represent an essentially complete solar cell. As described in greater detail below, in an embodiment, a completed solar cell retains the patterned wet etchant-resistant polymer mask 214.

In another aspect, to form a solar module, the side tabs of corresponding solar cells should be electrically connected together into a string. After the etch process described above, the side tabs will be coated in resist. In an embodiment, if the resist is composed of a thermoplastic type, such as a polyolefin, then it is feasible to melt the resist from a local area on the tab during the tab welding process. In one such embodiment, heat and pressure are applied to a weld tool, such as a roller, and the resist is forced away from the bond location, allowing the metal tabs to make direct contact for a subsequent weld. Mechanical approaches, such as scraping, may also be used to remove the resist from the region to be welded.

Figure 3A:
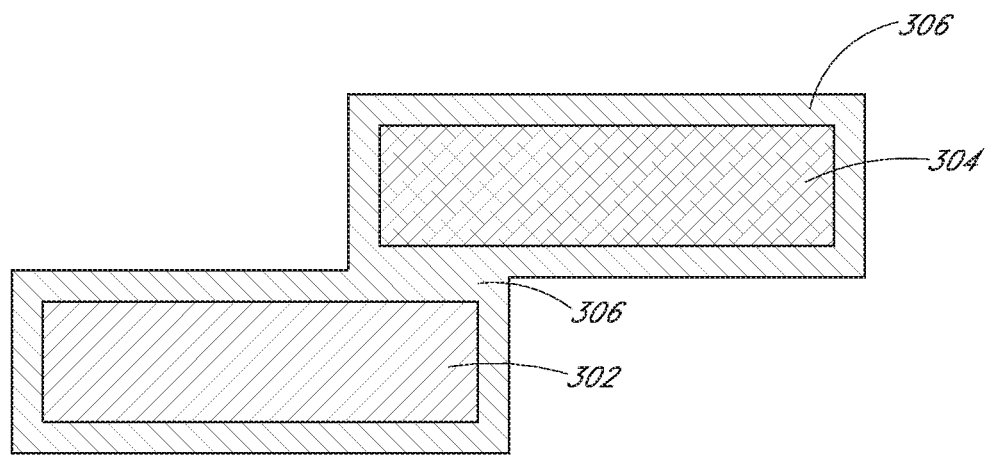
FIGS. 3A and 3B illustrate operations in a method of bonding tabs of adjacent solar cells, in accordance with an embodiment of the present invention.
Figure 3B:
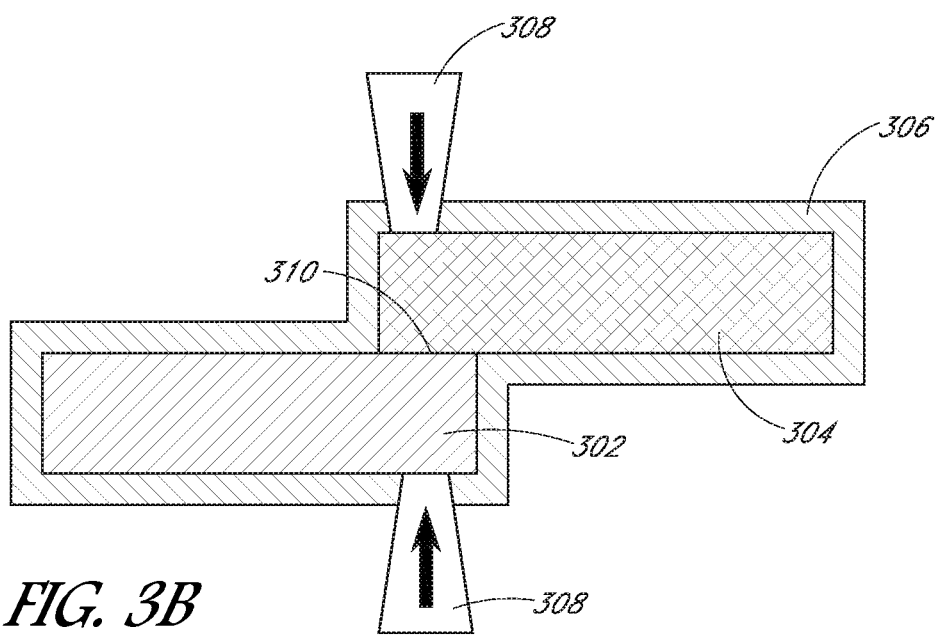

FIGS. 3A and 3B illustrate operations in a method of bonding tabs of adjacent solar cells, in accordance with an embodiment of the present invention. Referring to FIG. 3A, a first conductive tab 302 of a first solar cell is coated with a wet etchant-resistant polymer mask material 306. A second conductive tab 304 of a second solar cell is also coated with the wet etchant-resistant polymer mask material 306. Referring to FIG. 3B, local heat and pressure 308 is applied to melt and flow the wet etchant-resistant polymer mask material 306 away from the bond area 310. The bonded tabs 302 and 304 are then welded together during a stringing process. The weld may be formed by electrical current discharge, ultrasonic weld or laser.

Figure 4:
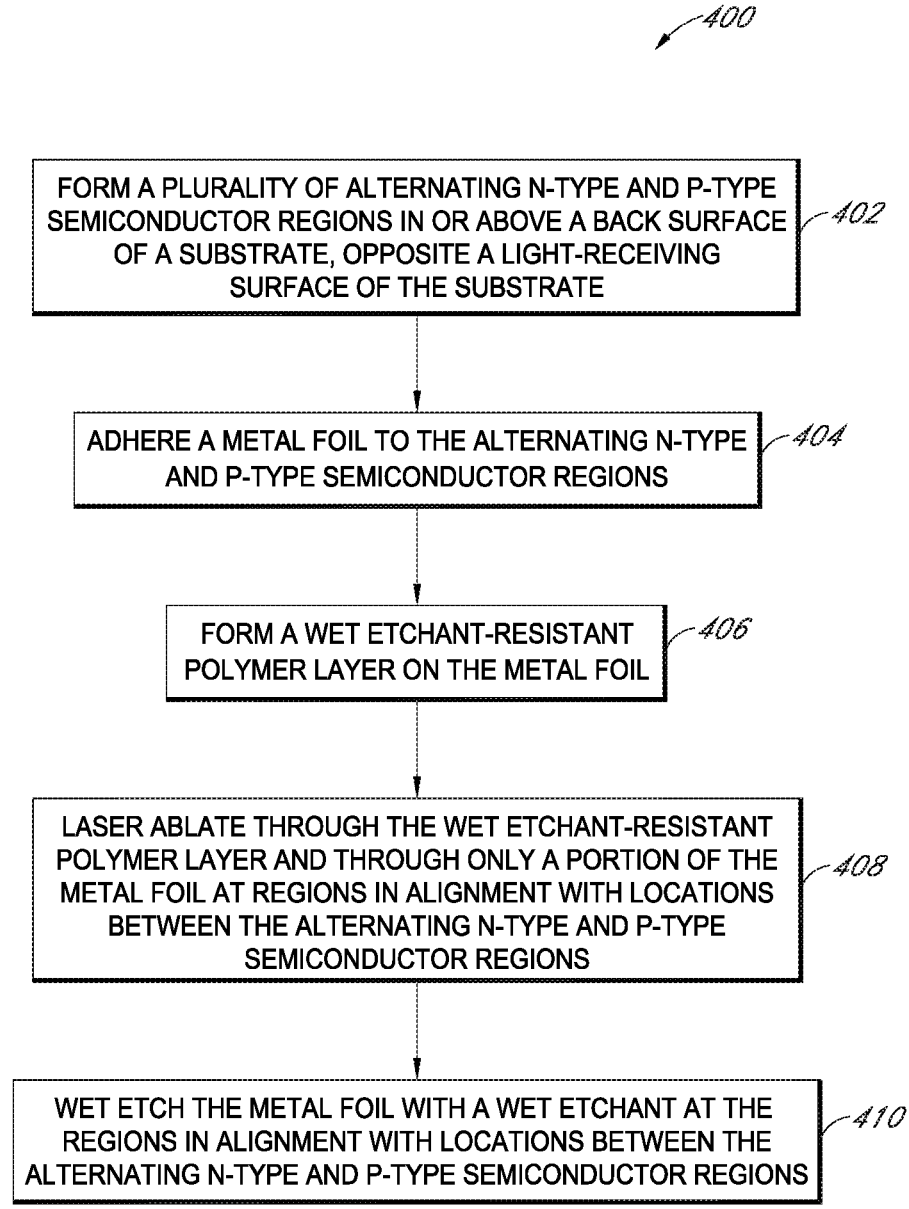
FIG. 4 is a flowchart illustrating operations in another method of fabricating a solar cell, in accordance with another embodiment of the present invention.
Figure 5A:
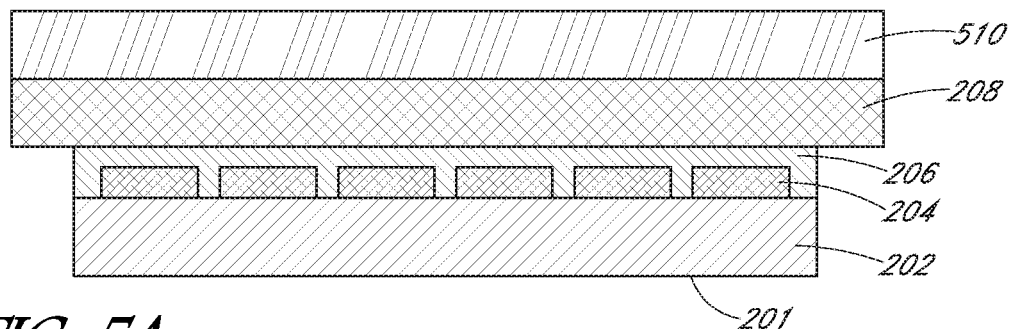
FIGS. 5A-5C illustrate cross-sectional views of various operations corresponding to the flowchart of FIG. 4, in accordance with an embodiment of the present invention.
Figure 5B:
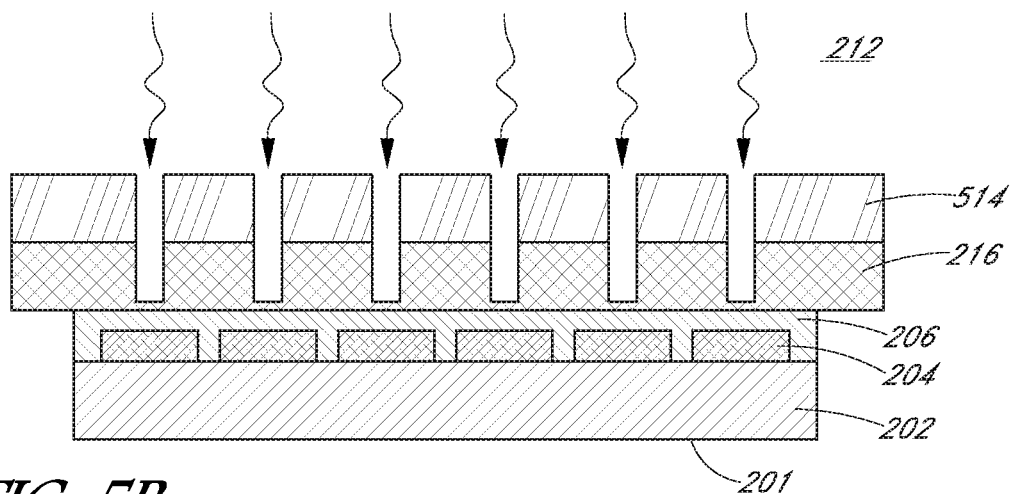
Figure 5C:
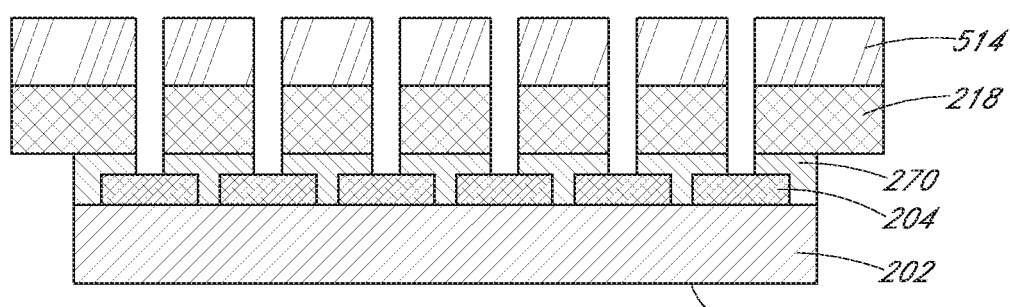

In a second approach, a patterned etch resistant mask is used, and does not encapsulate the entire metal foil and cell assembly. FIG. 4 is a flowchart 400 illustrating operations in another method of fabricating a solar cell, in accordance with another embodiment of the present invention. FIGS. 5A-5C illustrate cross-sectional views of various operations corresponding to the flowchart 400 of FIG. 4, in accordance with an embodiment of the present invention.

Referring to operation 402 of flowchart 400, a method of fabricating a solar cell includes forming a plurality of alternating N-type and P-type semiconductor regions in or above a back surface of a substrate 202, opposite a light-receiving surface of the substrate 201, as was described in association with FIGS. 2A and 2B. Referring to operation 404 of flowchart 400, the method also includes adhering a metal foil 208 to the alternating N-type and P-type semiconductor regions, as was described in association with FIG. 2C.

Referring to operation 406 of flowchart 400 and to corresponding FIG. 5A, the method of fabricating a solar cell also includes forming a wet etchant-resistant polymer layer 510 on the metal foil 208, but not on the light-receiving surface 201 of the substrate 202. In one embodiment, forming the wet etchant-resistant polymer layer 510 involves forming a layer of an epoxy material as the wet etchant-resistant polymer layer 510. In another embodiment, forming the wet etchant-resistant polymer layer 510 involves forming a layer of a polyolefin material as the wet etchant-resistant polymer layer 510.

In an embodiment, the wet etchant-resistant polymer layer 510 is a material substantially transparent to light (e.g., a polyolefin) for enablement of solar energy production, and is also resistant to a subsequent etch chemistry. However, in other embodiments, since the wet etchant-resistant polymer layer 510 may not be formed on the light-receiving side of the solar cell, non-transparent or other non-polymers may be used. For example, in other embodiments, the wet etchant-resistant polymer layer 510 is a thick or thin organic and inorganic layer, metal layer, insulator layer, etc. In a specific such embodiment, a thin layer of Cu is deposited on the Al foil to provide etch resistance for certain chemistries. In another specific embodiment, SiN or a thick a thick oxide (e.g, $SiO_2$) is used.

Referring to operation 408 of flowchart 400 and to corresponding FIG. 5B, the method of fabricating a solar cell also includes laser ablating 212 through the wet etchant-resistant polymer layer 510 and through only a portion of the metal foil 208 at regions in alignment with locations between the alternating N-type and P-type semiconductor regions. The laser ablating 212 forms a patterned wet etchant-resistant polymer mask 514 from the wet etchant-resistant polymer layer 510. The laser ablating 212 also forms a partially patterned metal foil 216. In an embodiment, the laser ablating 212 ablates a thickness approximately in the range of 80-99% of an entire thickness of the metal foil 208.

Alternatively, in another embodiment, an epoxy mask is screen printed as a patterned etch resistant mask for an aluminum foil. In one such embodiment, the patterned epoxy mask is thus patterned without the use of a laser process. Such printing of a patterned mask can be performed before or after ablating the foil. Subsequently, a laser and wet etching or a wet etching only process can be implemented to pattern the underlying metal foil.

Referring to operation 410 of flowchart 400 and to corresponding FIG. 5C, the method of fabricating a solar cell includes, subsequent to the laser ablating 212, wet etching the patterned metal foil 216 with a wet etchant at the regions in alignment with locations between the alternating N-type and P-type semiconductor regions (e.g., to expose portions of the patterned insulating layer 204). The wet etching isolates remaining portions 218 of the metal foil 208 in alignment with the alternating N-type and P-type semi-conductor regions of the substrate 202. The patterned wet etchant-resistant polymer mask 514 protects other regions of the patterned metal foil 216 from damage or erosion during the wet etch treatment.

In an embodiment, wet etching the exposed regions of the patterned metal foil 216 with the wet etchant involves etching using a wet etchant such as, but not limited to, a solution of potassium hydroxide (KOH), a solution of sodium hydroxide (NaOH), a solution of hydrochloric acid, or a phosphoric acetic water nitric (PAWN) etchant. In an embodiment, where a metal seed material layer 206 is included, the wet etching process also patterns the metal seed material layer 206 to form isolated metal seed material regions 220. Accordingly, in one such embodiment, wet etching the metal seed material layer 206 with the wet etchant involves exposing portions of a patterned bottom anti-reflective coating (BARC) layer formed at locations between the alternating N-type and P-type semiconductor regions of the substrate 202, as is depicted in FIG. 5C.

The solar cell depicted in FIG. 5C, as an isolated structure, can represent an essentially complete solar cell. As described in greater detail below, in an embodiment, a completed solar cell retains the patterned wet etchant-resistant polymer mask 514.

Referring to both FIGS. 2F and 5C, a completed solar cell includes a substrate 202 having a back surface and an opposing light-receiving surface 201. A plurality of alternating N-type and P-type semiconductor regions is disposed in or above the back surface of the substrate 202. A conductive contact structure is disposed on the plurality of alternating N-type and P-type semiconductor regions. The conductive contact structure includes metal foil portions 218 in alignment with corresponding ones of the alternating N-type and P-type semiconductor regions. A patterned wet etchant-resistant polymer layer 214 or 514 is disposed on the conductive contact structure. Portions of the patterned wet etchant-resistant polymer layer 214 or 514 are disposed on and in alignment with the metal foil portions 218.

In an embodiment, the patterned wet etchant-resistant polymer layer 214 or 514 includes a material such as, but not limited to, a polyolefin material layer or an epoxy material layer. In an embodiment, referring only to FIG. 2F, a portion of the patterned wet etchant-resistant polymer layer 214 is disposed on the light-receiving surface 201 of the substrate 202. In another embodiment, the patterned wet etchant-resistant polymer layer 214 is not disposed on the light-receiving surface 201 of the substrate 202.

In an embodiment, the conductive contact structure further includes a plurality of metal seed material regions 220 providing a metal seed material region disposed on each of the alternating N-type and P-type semiconductor regions. The metal foil portions 218 are disposed on the plurality of metal seed material regions 220, as is depicted in FIGS. 2F and 5C.

Although certain materials are described specifically with reference to above described embodiments, some materials may be readily substituted with others with such embodiments remaining within the spirit and scope of embodiments of the present disclosure. For example, in an embodiment, a different material substrate, such as a group III-V material substrate, can be used instead of a silicon substrate. Additionally, although reference is made significantly to back contact solar cell arrangements, it is to be appreciated that approaches described herein may have application to front contact solar cells as well. In other embodiments, the above described approaches can be applicable to manufacturing of other than solar cells. For example, manufacturing of light emitting diode (LEDs) may benefit from approaches described herein.

Thus, approaches for fabricating foil-based metallization of solar cells based on a leave-in etch mask, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, comprising:
   a substrate having a back surface and an opposing light-receiving surface;
   a plurality of N-type and P-type semiconductor regions disposed in or above the back surface of the substrate;
   a conductive contact structure disposed on the plurality of N-type and P-type semiconductor regions, the conductive contact structure comprising metal foil portions in alignment with corresponding ones of the N-type and P-type semiconductor regions, wherein one or more of the metal foil portions extends laterally beyond the substrate; and
   a patterned epoxy material layer disposed on the conductive contact structure, the patterned epoxy material layer disposed on and in alignment with the metal foil portions, and the patterned epoxy material layer coating a top, a bottom and ends of each of the one or more of the metal foil portions that extends laterally beyond the substrate.

2. The solar cell of claim 1, wherein the patterned epoxy material layer is disposed directly on sides of the substrate and directly on sides of the metal foil, and wherein a portion of the patterned epoxy material layer disposed on the substrate is continuous with a portion of the patterned epoxy material layer on the metal foil.

3. The solar cell of claim 1, wherein a portion of the patterned epoxy material layer is disposed over the light-receiving surface of the substrate.

4. The solar cell of claim 1, wherein a portion of the patterned epoxy material layer is disposed on an anti-reflective coating (ARC) material disposed on the light-receiving surface of the substrate.

5. The solar cell of claim 1, wherein the conductive contact structure further comprises a plurality of metal seed material regions disposed on each of the N-type and P-type semiconductor regions, and wherein the metal foil portions are disposed on the plurality of metal seed material regions.

6. The solar cell of claim 1, wherein a portion of the conductive contact structure is disposed on a bottom anti-reflective coating (BARC) material disposed on the N-type and P-type semiconductor regions.

7. The solar cell of claim 1, wherein the N-type and P-type semiconductor regions comprise N-type and P-type polycrystalline silicon regions.

8. The solar cell of claim 1, wherein the N-type and P-type semiconductor regions are disposed on a thin dielectric layer disposed on the back surface of the substrate.

9. The solar cell of claim 1, wherein the substrate is a monocrystalline silicon substrate.

10. A solar cell, comprising:
a substrate having a back surface and an opposing light-receiving surface;
a plurality of N-type and P-type semiconductor regions disposed in or above the back surface of the substrate;
a conductive contact structure disposed on the plurality of N-type and P-type semiconductor regions, the conductive contact structure comprising metal foil portions in alignment with corresponding ones of the N-type and P-type semiconductor regions, wherein one or more of the metal foil portions extends laterally beyond the substrate; and
a patterned polyolefin material layer disposed on the conductive contact structure, the patterned polyolefin material layer disposed on and in alignment with the metal foil portions, and the patterned polyolefin material layer coating a top, a bottom and ends of each of the one or more of the metal foil portions that extends laterally beyond the substrate.

11. The solar cell of claim 10, wherein the patterned polyolefin material layer is disposed directly on sides of the substrate and directly on sides of the metal foil, and wherein a portion of the patterned polyolefin material layer disposed on the substrate is continuous with a portion of the patterned polyolefin material layer on the metal foil.

12. The solar cell of claim 10, wherein a portion of the patterned polyolefin material layer is disposed over the light-receiving surface of the substrate.

13. The solar cell of claim 10, wherein a portion of the patterned polyolefin material layer is disposed on an anti-reflective coating (ARC) material disposed on the light-receiving surface of the substrate.

14. The solar cell of claim 10, wherein the conductive contact structure further comprises a plurality of metal seed material regions disposed on each of the N-type and P-type semiconductor regions, and wherein the metal foil portions are disposed on the plurality of metal seed material regions.

15. The solar cell of claim 10, wherein a portion of the conductive contact structure is disposed on a bottom anti-reflective coating (BARC) material disposed on the N-type and P-type semiconductor regions.

16. The solar cell of claim 10, wherein the N-type and P-type semiconductor regions comprise N-type and P-type polycrystalline silicon regions.

17. The solar cell of claim 10, wherein the N-type and P-type semiconductor regions are disposed on a thin dielectric layer disposed on the back surface of the substrate.

18. The solar cell of claim 10, wherein the substrate is a monocrystalline silicon substrate.

19. A solar cell, comprising:
a substrate having a back surface and an opposing light-receiving surface;
a plurality of N-type and P-type semiconductor regions disposed in or above the back surface of the substrate;
a conductive contact structure disposed over the plurality of N-type and P-type semiconductor regions, the conductive contact structure comprising metal foil portions in alignment with corresponding ones of the N-type and P-type semiconductor regions, wherein one or more of the metal foil portions extends laterally beyond the substrate; and
a patterned wet etchant-resistant polymer layer disposed on the conductive contact structure, the patterned wet etchant-resistant polymer layer disposed on and in alignment with the metal foil portions, and the patterned wet etchant-resistant polymer layer coating a top, a bottom and ends of each of the one or more of the metal foil portions that extends laterally beyond the substrate.

20. The solar cell of claim 19, wherein the patterned wet etchant-resistant polymer layer is disposed directly on sides of the substrate and directly on sides of the metal foil, and wherein a portion of the patterned wet etchant-resistant polymer layer disposed on the substrate is continuous with a portion of the patterned wet etchant-resistant polymer layer on the metal foil.

* * * * *